(12) United States Patent
Jarvis et al.

(10) Patent No.: US 7,195,931 B2
(45) Date of Patent: Mar. 27, 2007

(54) SPLIT MANUFACTURING METHOD FOR ADVANCED SEMICONDUCTOR CIRCUITS

(75) Inventors: Richard Wayne Jarvis, Kailua-Kona, HI (US); Michael G. McIntyre, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 369 days.

(21) Appl. No.: 10/305,670

(22) Filed: Nov. 27, 2002

(65) Prior Publication Data

US 2004/0102019 A1 May 27, 2004

(51) Int. Cl.
*G01R 31/26* (2006.01)
*H01L 21/66* (2006.01)

(52) U.S. Cl. .................. 438/14; 438/15; 257/E21.568; 257/E23.179

(58) Field of Classification Search ............ 438/14–16, 438/693, 928, 18; 257/E21.525, E21.568, 257/E23.179, E33.056, E33.058
See application file for complete search history.

(56) References Cited

U.S. PATENT DOCUMENTS

| | | | |
|---|---|---|---|
| 5,817,541 A | 10/1998 | Averkiou et al. | |
| 5,872,018 A * | 2/1999 | Lee | ............... 438/18 |
| 5,888,838 A * | 3/1999 | Mendelson et al. | ........... 438/15 |
| 5,977,558 A * | 11/1999 | Lee | ............... 257/48 |
| 6,171,873 B1 * | 1/2001 | Mendelson et al. | ........... 438/14 |
| 6,222,145 B1 * | 4/2001 | Cook et al. | ............... 209/573 |
| 6,222,212 B1 | 4/2001 | Lee et al. | |
| 6,281,576 B1 * | 8/2001 | Hakey et al. | ............... 438/455 |
| 6,335,210 B1 * | 1/2002 | Farooq et al. | ............... 438/15 |
| 6,383,893 B1 * | 5/2002 | Begle et al. | ............... 438/460 |
| 2002/0039807 A1 | 4/2002 | Koyama | |

FOREIGN PATENT DOCUMENTS

WO WO 90/09093 8/1990
WO WO 01/41207 A1 6/2001

OTHER PUBLICATIONS

Kamogawa, et al., "Now Methodology for Microwave/Millimeter-Wave MMIC developemnt," Microwave Symposium Digest, 2000 IEEE MIT-S International Boston, MA USA, Jun. 11-16, 2000, Piscataway, NJ USA, IEEE, Jun. 11, 2000, pp. 1913-1916, XP010507236 ISBN: 0-7803-5687-X.

Toyoda, et al., "Quick Development of Multifunctional MMICs by Using three-Dimensional Masterslice MMIC Technology," IEICE Transactions on Electronics, Institute of Electronics Inforamtion and Comm. Eng. Tokyo, JP, vol. E82-C, No. 11, Nov. 1999, pp. 1951-1959, XP000931560 ISSN: 0916-8524.

Tokumitsu, et al., "Three-Dimensional MMIC Technology and Application to Millimeter-Wave MMICs," Millimeter Waves, 1997 Topical Symposium on Kanagawa, Japan, Jul. 7-8, 1997, New York, NY USA, IEEE, US, Jul. 7, 1997, pp. 97-100, XP010289058 ISBN: 0-7803-3887-1.

* cited by examiner

*Primary Examiner*—Walter L. Lindsay, Jr.

(57) ABSTRACT

A front-end-of-line piece of a semiconductor die is manufactured in a first manufacturing line. A back-end-of-line piece of a semiconductor die is manufactured using a second manufacturing line, which will typically be different than the first manufacturing line. The front-end-of-line piece and the back-end-of-line piece are combined during a joining process to form a semiconductor die. The semiconductor die is subsequently tested to determine if the semiconductor die is a functional semiconductor die.

27 Claims, 7 Drawing Sheets

SPLIT MANUFACTURING METHOD FOR ADVANCED SEMICONDUCTOR CIRCUITS

FIELD OF THE DISCLOSURE

This invention relates generally to semiconductor devices, and more specifically to a method of manufacturing a semiconductor device.

BACKGROUND

Semiconductor manufacturing, from early manufacturing up to the present VLSI and ULSI integrated circuits, has been largely driven by the need to increase the speed and density of the device formed thereon. This is typically accomplished by implementing more aggressive design rules to allow smaller transistors to be formed. As transistor sizes shrink, the area to form conductive interconnect layers is reduced, and more aggressive processes are required to minimize the dimensions of interconnect layers formed, or more interconnect layers need to be formed to perform the necessary routing. Additionally, these interconnects must accommodate the power distribution and power dissipation requirements of more and smaller transistors.

It is well known that a single defect in a metal interconnect layer can render a device useless. Unfortunately, these metal interconnect defects are discovered only after the costly steps of forming the active transistor devices. For this reason a method of forming a finished semiconductor device that reduces the number of device defects caused by the metal layers of a semiconductor device would be useful.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements for clarity. Various objects, advantages, features and characteristics of the present disclosure, as well as methods, operation, and functions of related elements of structure, and the combination of parts and economies of manufacture, will become apparent upon consideration of the following description and claims with reference to the accompanying drawings, all of which form a part of this specification, wherein like reference numerals designate corresponding parts in the various figures, and wherein:

DETAILED DESCRIPTION OF THE FIGURES

Figure 1:
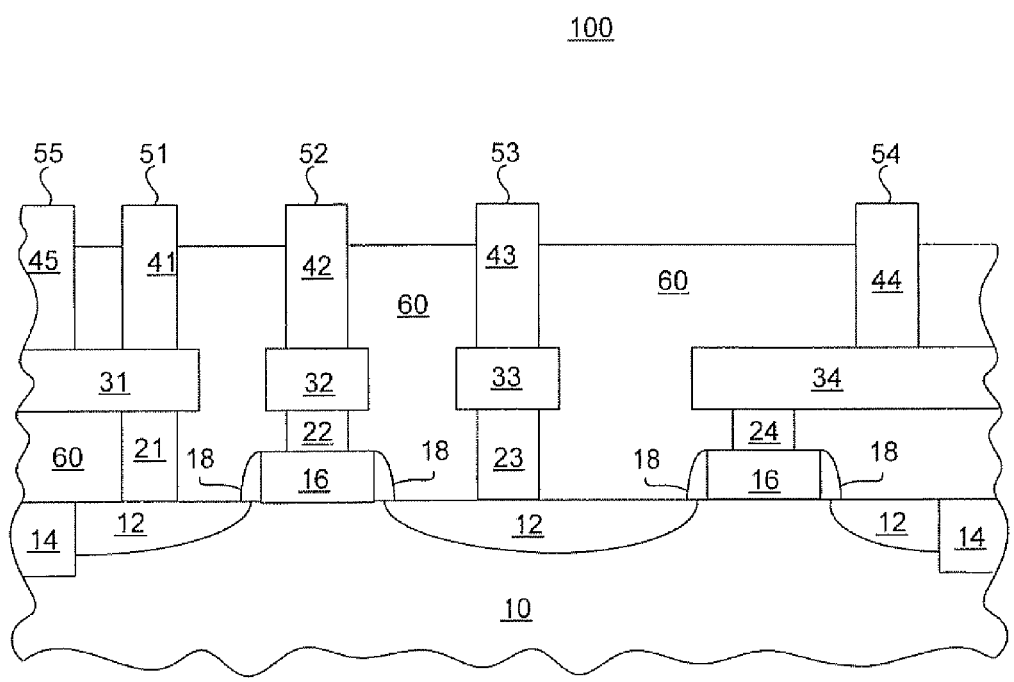
FIG. 1 is a cross-sectional diagram of a portion of a semiconductor device produced in a front-end-of-line (FEOL) process according to at least one embodiment of the present disclosure.

A method is presented to improve finished product yield in a semiconductor manufacturing process by eliminating parts with faults from a back-end-of-line (BEOL) metal interconnect process to parametrically tested good work pieces of a front-end-of-line (FEOL) transistor formation process. Unlike the current trend toward integrating increasingly complex wafer level processes including both FEOL and BEOL processes, the present invention splits or separates the processes by building the BEOL piece separately from the FEOL piece. The FEOL and BEOL pieces are then merged using an alignment procedure such as optical alignment.

FIGS. 1 through 8 illustrate an embodiment of the method for a typical fabrication process. In the various embodiments, the FEOL workpiece is processed as usual to the current technology. In one embodiment, the FEOL process is completed to include at least one metal interconnect layer seen in FIG. 1. The inclusion of a metal interconnect layer facilitates performance of electrical parametric testing of FEOL piece 100 to assist in identifying known good die. In the embodiment illustrated, FEOL piece 100 includes a semiconductor substrate 10, gates 16, source/drain regions 12, isolation regions 14, spacers 18, contacts 21, 22, 23, dielectric material 60, first level metal interconnects 31, 32, 33, and 34, and protruding vias 41, 42, 43, 44, and 45. In one embodiment, the fabrication of FEOL piece 100 comprises manufacturing a FEOL piece 100 having a transistor and at least one contact interconnect layer. Note, in other embodiments, the contacts 21–23 can be the protruding interface features.

The method employs an interface layer concept for a front-end-of-line process piece such as FEOL piece 100. This interface layer concept is also extended to a back-end-of-line process piece as well. As an example of this interface layer concept, the protruding contacts 41–45 of front-end piece 100 may be thought of as a "male" portion of an interface feature, e.g., a protruding attachment point, for connecting or joining with a "female" interface feature, e.g., a receiving portion, on a BEOL or back end piece (illustrated in FIG. 2). Front end piece 100 represents a portion of a semiconductor device, e.g., transistors, which, when joined with the back end piece of FIG. 2, will form a functional semiconductor device, e.g., an operational integrated circuit. While the male portion has been described as being a part of the FEOL piece, it will be appreciated that it can reside on the BEOL, and likewise the female portion can be on the FEOL piece.

The various techniques employed to form the front-end interface features 41–45 are well known in the art. In an embodiment, the shape and/or size of the front-end interface features 41–45 are constrained by minimum spacing requirements, as an alignment accuracy of approximately 100 nm is desired. When an optical alignment tool is used to join the FEOL piece 100 to the back-end piece, the size of the interface features 41–45 will be dependent upon the limitations of a particular optical alignment tool. This limitation generally means that the size of the interface features 41–45 will be on the order of approximately 1 to 2 times a minimum design rule.

Figure 2:
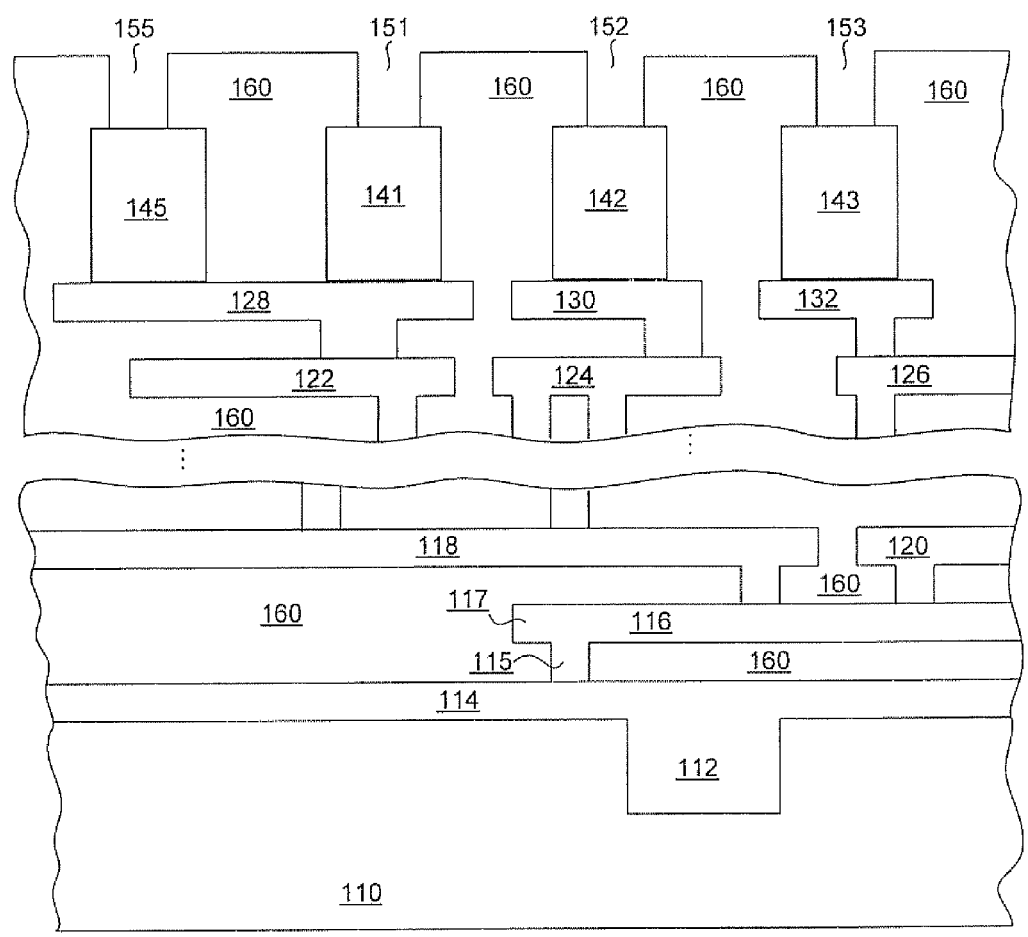
FIG. 2 is a cross-sectional diagram of a portion of a semiconductor device produced in a back-end-of-line (BEOL) process according to at least one embodiment of the present disclosure.

Referring now to FIG. 2, a cross-sectional illustration of a portion of a back-end piece 200 according to an embodiment of the present disclosure, will be discussed. Back-end-of-line (BEOL) piece is preferably separately processed/manufactured from FEOL piece 100. BEOL piece 200 includes a substrate 110, a metal interconnect structure 114 which includes a bond pad portion 112, a metal interconnect structure 116 which includes a via/contact 115. In the example of FIG. 2, back end piece 200 also is manufactured to have a plurality of metal layers such as intralevel metal interconnects 122, 124, 126, 128, 130, and 132, as well as metal layer interconnects 116, 118, and 120. In this example, BEOL piece 200 is manufactured using a damascene or dual damascene process to form as many metal layers as needed, and design rules necessary for high yields and reliability. The design rules are not limited to damascene processes, however, as methods may be employed for other design rules when desired. The plurality of metal interconnects/layers 116–132 are surrounded by a dielectric material 160 between and around the plurality of interconnects. The ellipses in FIG. 2 indicate various other intralevel metal interconnects that may be found in a back end piece such as BEOL piece 200, but are not indicated in FIG. 2 in order to keep the drawing straightforward. The techniques employed and metals used to form the back end metal layers are dependent upon the process technology in use during manufacturing, e.g., dual damascene, aluminum, et cetera, and are well known to those of skill in the art.

Figure 3:
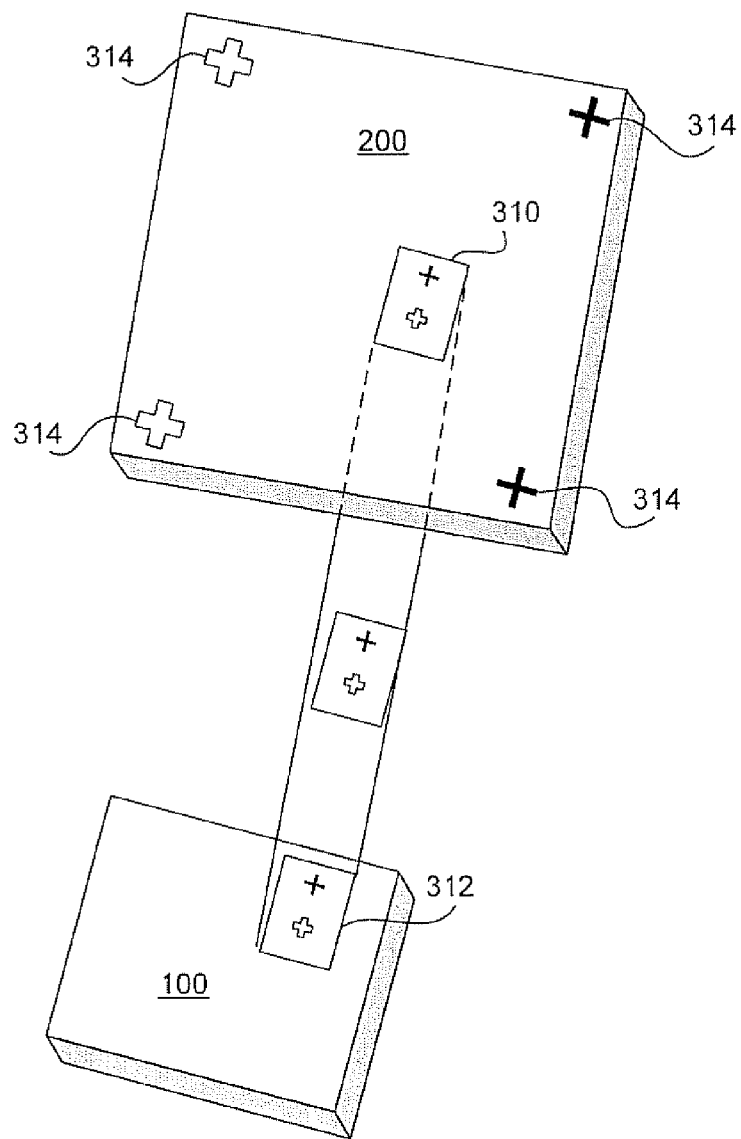
FIG. 3 is an illustration of a die-to-die alignment according to at least one embodiment of the present disclosure.

The receiving contacts 141–145 adjoining the metal interconnects 128, 130, and 132, in conjunction with the receiving locations 151–155, serve as the receiving portion for the protruding contacts for the interface features 41–45 of the FEOL piece 100 when joining the FEOL piece 100 to the BEOL piece 200 to form a functional semiconductor device, as illustrated in FIG. 3.

In the example illustrated in FIG. 2, substrate 110 is first patterned with a bond pad layer 114, which includes bond pad portion 112. When optical alignment is to be used, at least a portion of substrate 110 may be SiO2 (quartz), clear polymers, diamonds, or other suitable optically transparent material such as a transparent dielectric material upon which to build the bond pad portion 112 and the subsequent interconnected metal layers, e.g., 116, 118, 120, 124, 126, 128, 130, and 132. After formation of the receiving contacts 141–145 and receiving locations 151–155, the substrate 110 is thinned through mechanical or chemical means, dependent upon the materials or process chosen, as known in the art, to allow for electrical contact to the bond pad portion 112. During the thinning process, a sufficient thickness of substrate 110 should be permitted to remain in order to provide structural stability for BEOL piece 200 and/or support for the functional device after joining with FEOL piece 100. This remaining thickness will be dependent upon the selection of material for substrate 110. In at least one embodiment, following substrate 110 thinning, the BEOL piece 200 is electrically tested for good yield, and only BEOL pieces which pass testing as 'good' will be joined with FEOL pieces such as FEOL piece 100.

During processing of the BEOL piece 200 and the FEOL piece 100, a primary alignment mark 310 is placed on BEOL piece 200 and a primary alignment feature or mark 312 is placed on FEOL piece 100, as seen in FIG. 3. In one embodiment, the alignment feature 312 will be formed at the bond pad layer. FIG. 3 illustrates a back-end piece 200 to front-end piece 100 (die-to-die) alignment technique according to at least one embodiment of the present disclosure. In addition to the primary alignment features 310 and 312, optional secondary alignment features 314 may be utilized on BEOL piece 200. The primary alignment marks 310 and 312 serve to provide structure matching, e.g., aligning of the interface features (protruding contacts 41–45) of the FEOL piece 100 to the receiving locations 151–155 of the BEOL piece 200. The secondary alignment features 314 serve to meet secondary alignment requirements if desired. It should be noted that although an embodiment discloses the use of optical equipment for alignment purposes, it is possible to utilize mechanical alignment, or electrical alignment, as a means for aligning FEOL piece 100 and BEOL piece 200, in which case optical alignment features would not be necessary.

Since the substrate 110 and dielectrics 160 of the BEOL piece 200 are manufactured using optically transparent materials, an optical alignment tool is utilized to join or merge the two pieces 200, 100. The use of optically transparent materials and alignment marks 310, 312, permits "look through" of the BEOL piece 200 to the FEOL piece 100 for alignment of receiving locations 151–155 to interface features 41–45. Merge tolerances are consistent with the tolerances of the FEOL piece at the FEOL piece interface layer. For example, a FEOL piece having an interface layer at the filled contact level will be the most restrictive alignment tolerance. While a FEOL piece having an interface layer at a via layer could have a less restrictive alignment tolerance.

As seen in FIG. 3, embodiments of the present method do not require the BEOL piece 200 to be the same size as FEOL piece 100. Preferably in practice, size of the front-end piece 100 is optimized for cost and transistor performance, while the size of the back-end piece 200 is optimized for cost and best resistance and capacitance (R/C) technology. Because the BEOL piece 200 can be manufactured separately from the FEOL piece 100, the method permits maximization of the area of the back-end substrate 110, e.g., silicon, in order to maximize the back-end process yield, not the front-end density, thereby lowering costs and reducing manufacturing time. Additionally, since the BEOL piece 200 yield is know to be 100% (as only tested "good" BEOL pieces are used to join with FEOL pieces), the present method maximizes FEOL yield at minimum risk.

Figure 4:
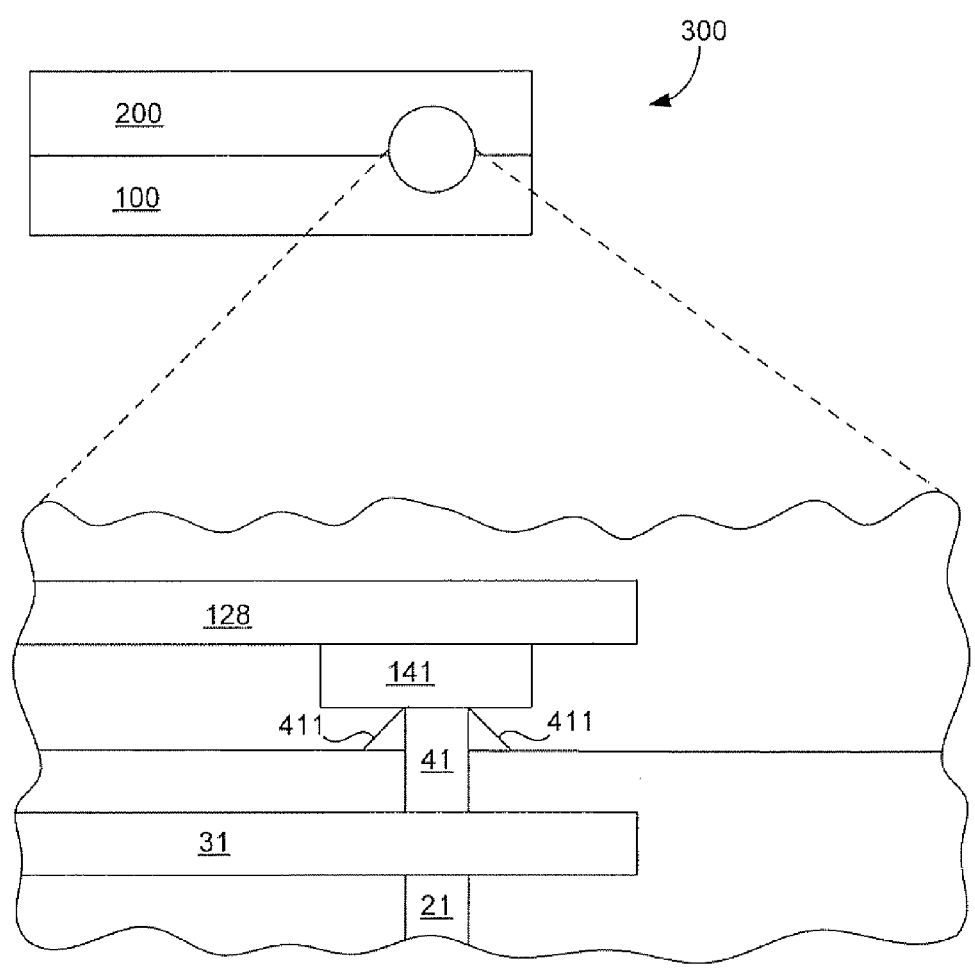
FIG. 4 is an illustration of a functional device showing detail of the joining of a FEOL piece to a BEOL piece according to an embodiment of the present disclosure.

FIG. 4 illustrates a functional device 300 which results from the merging or joining of a FEOL piece 100 with a BEOL piece 200. The merge point is enlarged in FIG. 4 to show detail. In the example shown in FIG. 4, FEOL piece 100 and BEOL piece 200 are similar in size. After the merge, the interface feature 41 (protruding contact) of FEOL piece 100 is in contact with the receiving contact 141 of BEOL piece 200. Also shown for FEOL piece is the first level metal interconnect 31, and a contact 21. The metal interconnect layer 128 is shown for BEOL piece 200. An alignment structure 411 may be present to facilitate the alignment process. Generally, the funnel shape will facilitate a low resistance during the joining procedure.

In order to keep piece 100 and piece 200 together to form the functional device 300, a two-part epoxy or spin-on glue may be used. The choice of adhesive material should be such that its adhesion properties will not be significantly affected at operating temperatures, nor by heating to between about 250–300 degrees Celsius for metal eutectics. In one embodiment, one of the surfaces, e.g., the surface containing "female" interface features (e.g., the receiving contacts 141–145 in FIG. 2) is manufactured with a "soft" metal such as aluminum, while the other surface of the other piece containing "male" interface features (e.g., protruding contacts 41–45 in FIG. 1) is manufactured with a "hard" metal such as tungsten (or other suitable conductor). During merging of the pieces 100 and 200, the use of dissimilar metals permits greater flexibility during the vertical alignment of the pieces 100 and 200. Conversely, the situation may be reversed, that is, the "female" features may be a hard metal, while the "male" features may be a soft metal.

Figure 5:
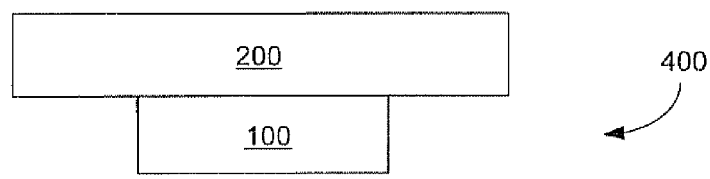
FIG. 5 is an illustration of a functional device showing a size difference between the BEOL piece and the FEOL piece according to an embodiment of the present disclosure.

FIG. 5 illustrates a functional device 400 which results from the merging or joining of a FEOL piece 100 with a BEOL piece 200. The overall size of FEOL piece 100 is may be equal to, or less than BEOL piece 200, which is advantageous in some applications. An advantage of an embodiment of the present disclosure is that the size of the BEOL piece 200 is no longer constrained by the size of the FEOL piece 100. Thus the BEOL piece 200 can be made larger, which in turn could reduce the number of layers required to be manufactured for BEOL piece 200, but improves yields and has higher reliability.

A further advantage is that the number of layers required to interface FEOL piece 100 with BEOL piece 200 can also be reduced, as the present invention requires only one critical layer per piece (BEOL/FEOL) for joining purposes, instead of the many layers currently employed in the industry. This offers substantial wafer processing time and cost savings in FEOL manufacturing. When the BEOL piece 200 is constructed of inexpensive transparent materials and reduced design rules, this offers substantial cost savings as well.

Figure 6:
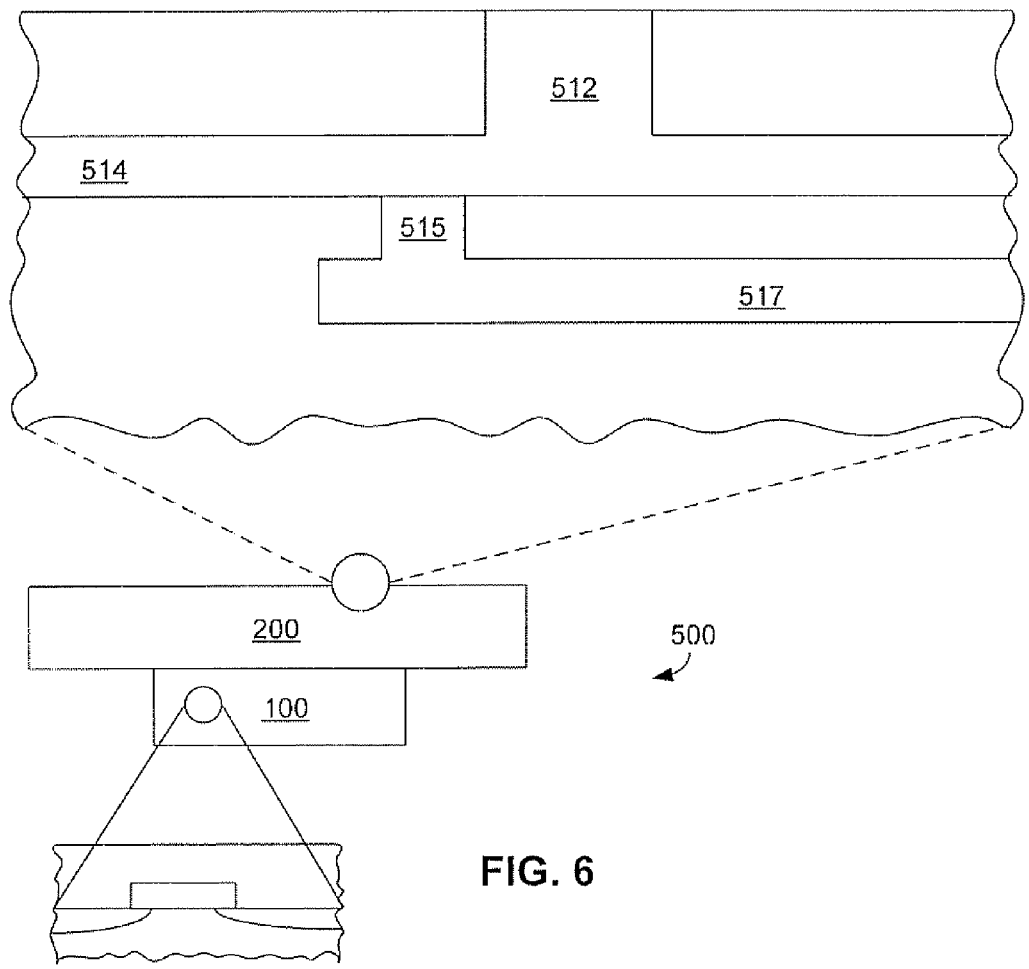
FIG. 6 is a cross-sectional illustration of the functional device of FIG. 5 showing detail of the BEOL piece according to an embodiment of the present invention.

FIG. 6 illustrates a cross sectional view of a device 500. Device 500 includes a BEOL piece 200 coupled to a FEOL piece 100 to form a functional device. FIG. 6 illustrates that a portion of the FEOL piece 100 includes transistors manufactured on a substrate, while a major surface of BEOL 200 piece includes a bond pad 512, coupled to metal layer 514. The metal layer 514 is further coupled to via 515, which is coupled to metal layer 517. The bond pad 512 is typically formed from the bond pad portion 112, of FIG. 1, by a removal process that removes the substrate portion overlying the bond pad portion 112. The removal process can be cleaving, back-grinding, chemical stripping, and other physical or chemical methods suitable to the type of substrate material, which are known in the art. Depending upon the type of device, the removal process can occur before or after merging of piece 200 and piece 100.

Figure 7:
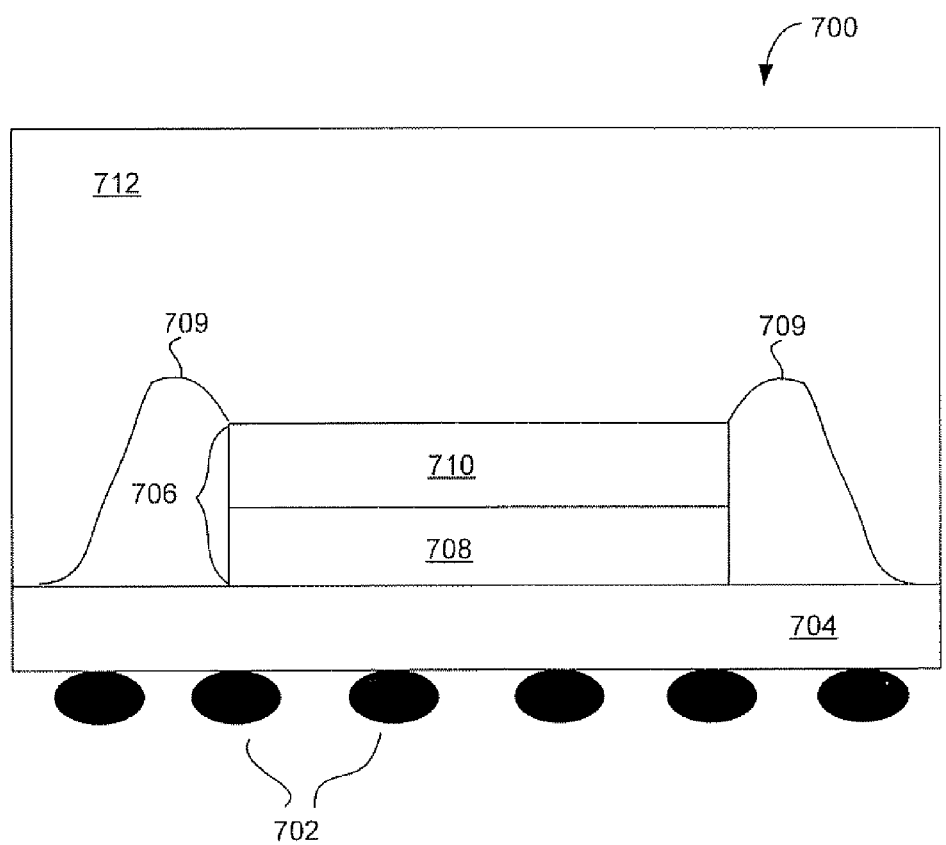
FIG. 7 is a cross-sectional illustration of a packaged device according to at least one embodiment of the present invention.

FIG. 7 illustrates a cross sectional view of a packaged semiconductor device 700. The packaged semiconductor device 700 includes external interconnects 702, a lead frame 704, die 706 (which include the BEOL 710 and FEOL 708), and an encapsulating material 712. While a wirebonded package is illustrated in the example of FIG. 7, other packages such as surface mount or flip chip may be used as well.

The method disclosed herein teaches a design philosophy which differs substantially from the current design philosophy. Current design philosophy advocates one device built with a single design philosophy which is applied to both front-end and back-end pieces, typically within the same company's manufacturing facilities. That is, the back-end pieces are not manufactured independently of the front-end portions, and the critical dimensions of the back-end portions are not independent of the front-end portions. The present method, however, comprises manufacturing a front-end portion of a semiconductor die, wherein the front-end portion has a first set of critical dimensions. Further, the method comprises manufacturing a back-end portion of a semiconductor die having a second set of critical dimensions independent of the front-end portion, and then joins or merges the front-end portion and the back-end portion using an interconnect layer.

In an embodiment, this interconnect layer has a first interface feature manufactured on the FEOL portion, and a second interface manufactured on the BEOL portion. When the first and second interface features are merged, this merging forms a functional semiconductor device. Manufacturing can occur within the same facility or foundry, or the FEOL or BEOL can be manufactured at a different facility or foundry. Design rules for the present disclosure need not be the same, that is, the FEOL piece can be manufactured to meet a design rule that is not required by the BEOL piece. The first interface feature must be compatible with the second interface feature, however, to facilitate the merging process. Compatibility of interface features means that the physical, metallurgical, and chemical properties of the first and second interface feature should be well-suited between the respective interfaces such that no problems are encountered after merging the FEOL and BEOL pieces via their interface features. This flexible design philosophy is reflected in FIG. 8.

Figure 8:
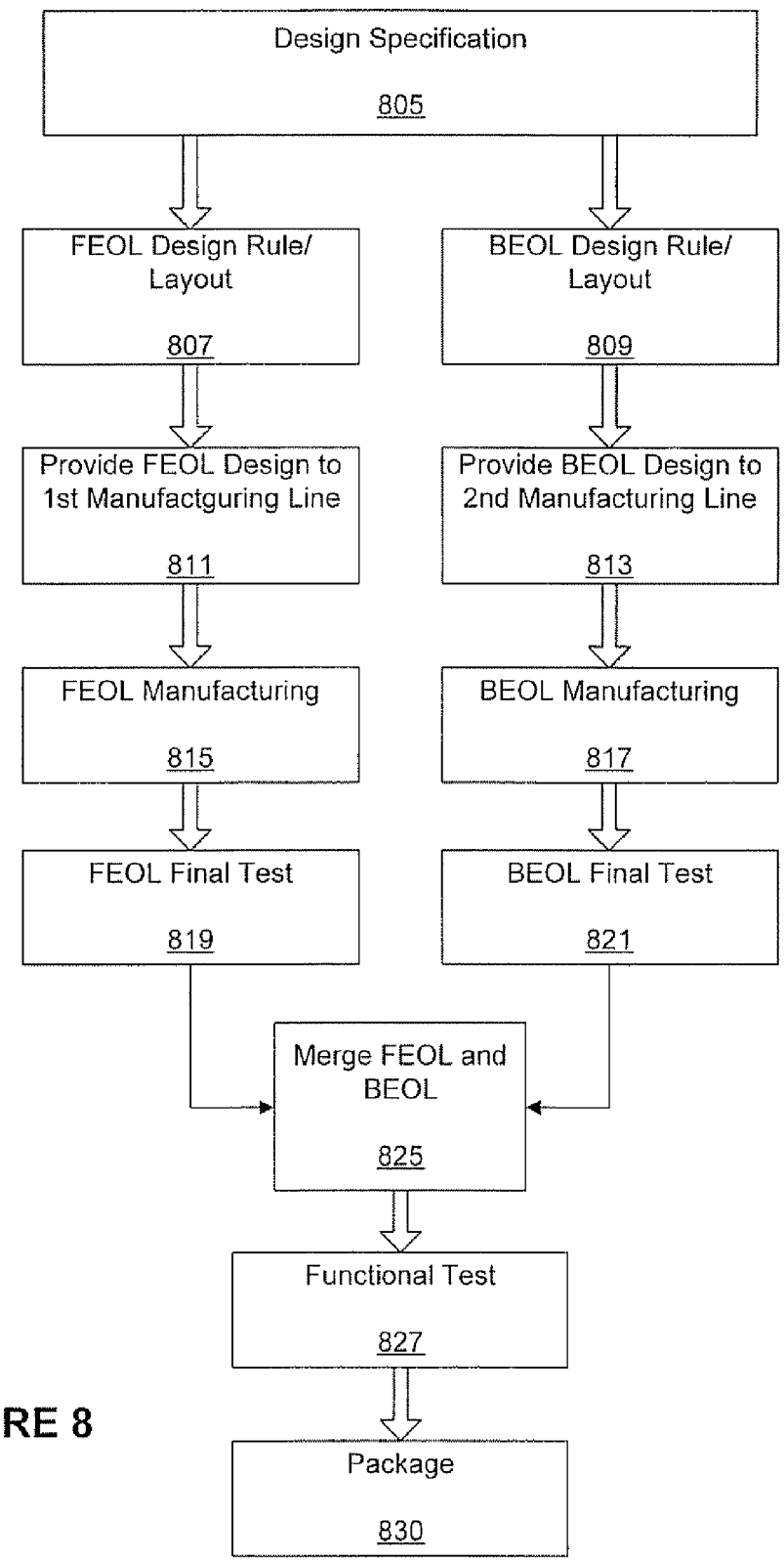
FIG. 8 is a flow diagram of a method for manufacturing semiconductor devices which results in finished package yield improvement according to at least one embodiment of the present invention.

FIG. 8 is a flow diagram of a method for manufacturing semiconductor dies which results in finished package yield improvement and reduced manufacturing time according to at least one embodiment of the present invention. In step 805, design specifications are determined, for example, a plurality of layers associated with a functional semiconductor die is defined. A first manufacturing specification defining a first portion of the semiconductor die as a front-end-of-line piece is defined in step 807. The design specification for the FEOL piece should be such that performance of the FEOL piece will be maximized for performance and cost. A second manufacturing specification defining a second portion of the semiconductor die as a back-end-of-line piece is defined in step 809. The design specification for the BEOL piece can be different from the FEOL piece design rules such that the BEOL can be optimized to its own set of cost/performance parameters, e.g., resistance and capacitance, power dissipation, and the like. Because the present invention advocates separate design philosophies, the method permits separate design rules. The design rules only need to be complimentary at the respective FEOL and BEOL interface layers.

After design specifications in step 805 have been determined, and the design rules/layout for FEOL piece design rules and/or layout formalized in step 807, the FEOL device manufacturing specifications are provided to a first manufacturing line at step 811. Similarly, the BEOL piece design rules and/or layout are formalized in step 809, and the manufacturing specifications are provided to a second manufacturing line at step 813. While the example of FIG. 8 discusses providing the separate design specifications to separate foundries, the FEOL piece design specifications or BEOL piece design specifications may be provided to different manufacturing lines within the same foundry, depending upon need or cost effectiveness. In either instance, the first foundry or production line must support a first set of design rules not required to be supported by the second foundry or production line.

It should be noted that manufacturing specifications determined using the teachings of the present disclosure permit determining a major surface area of the BEOL piece based upon a BEOL process, and determining a major surface area of the FEOL piece is based upon a FEOL process. The term major surface area refers to the largest area of the respective piece, for example, in the FEOL piece, the major surface area would consist of the largest surface of the active transistor device and its opposing side. The major surface area of the FEOL piece can be equal to or different than the major surface area of the BEOL piece, e.g., the BEOL major surface area can be greater than the major surface area of the FEOL piece. That is, the first major surface area of the FEOL piece can be less than the second major surface area of the BEOL piece. When the FEOL piece or die portion is coupled to the BEOL piece or die portion, a semiconductor device or die results.

In step 815, manufacturing of the FEOL piece takes place at the first manufacturing line, and separate manufacturing of the BEOL piece occurs at the second manufacturing line, as seen in step 817. The FEOL piece is manufactured to have a first interface feature, and the BEOL piece is manufactured to have a second interface feature. Even though the two pieces may be manufactured in different manufacturing lines, the first interface feature of the FEOL is compatible with the second interface feature of the BEOL piece. In one embodiment, the substrate of BEOL piece should be manufactured with at least a portion of an optically transparent material. The substrate of BEOL piece should contain a sufficient area of the optically transparent material to allow for alignment when optical alignment methods are used for subsequent piece merging. In another embodiment in which other alignment methods are to be used, e.g., mechanical alignment, the substrate of the BEOL piece does not have to be optically transparent.

During the FEOL piece manufacturing, optimal parametric testing can be performed on the FEOL piece to better differentiate FEOL piece quality. Continuity testing can also be performed on the BEOL piece during the step of manufacturing. A specific criteria result of the parametric testing on the FEOL piece dictates which FEOL pieces being manufactured are to be merged with a BEOL piece or BEOL pieces. Similarly, the results of the continuity testing on the BEOL pieces identify which BEOL pieces are to be merged with a FEOL piece or FEOL pieces. Final testing on the FEOL piece takes place in step 819, while final testing of the BEOL piece takes place in step 821.

Only those FEOL pieces and BEOL pieces passing their respective final tests will be subjected to the merging process to create a semiconductor die. The FEOL pieces are received from the first foundry, and the BEOL pieces are received from the second foundry and are joined or merged in step 825 to form a semiconductor die. After the step of merging in 825, the semiconductor die is subjected to functionality testing, as shown in step 827 to determine if the semiconductor die is a functional semiconductor die. Because testing of each piece occurs before joining the two pieces, the total yield of functional die will be increased over prior art final testing methods, which makes the present method advantageous from a cost-savings viewpoint, as well as time to manufacture, since both occur as parallel processes, as indicated in FIG. 8.

Following functional testing in step 827, the die is packaged in its final form, as was illustrated in the example shown in FIG. 7. In step 827, a package interconnect layer having pads or bumps that interface with package substrates or circuit board substrates is formed. Encapsulating material may then be applied to the packaged device.

The method and apparatus herein provides for a flexible implementation. Although the invention has been described using certain specific examples, it will be apparent to those skilled in the art that the invention is not limited to these few examples. For example, the disclosure is discussed herein primarily with regard to joining a front-end-of-line work piece and a back-end-of-line work piece for an integrated circuit device, however, the invention can be used to expand the functionality of other semiconductor devices,. For example, by integrating a memory FEOL and a processor FEOL onto a single BEOL piece. Although the disclosure discusses employing the method to merge a single FEOL piece with a single BEOL piece, the method can be employed to merge multiple FEOL pieces with multiple BEOL pieces, or a single FEOL piece with multiple BEOL pieces. Additionally, various types of manufacturing equipment and components are currently available which could be suitable for use in employing the method as taught herein. Note also, that although an embodiment of the present invention has been shown and described in detail herein, along with certain variants thereof, many other varied embodiments that incorporate the teachings of the invention may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method comprising:
   manufacturing a front-end-of-line (FEOL) piece of a semiconductor die;
   performing parametric testing on the FEOL piece;
   manufacturing a back-end-of-line (BEOL) piece of the semiconductor die; and
   joining the FEOL piece to the BEOL piece to form the semiconductor die subsequent to manufacturing the FEOL piece and the BEOL piece.

2. The method of claim 1 wherein manufacturing the FEOL piece further comprises manufacturing the FEOL piece having a transistor and at least one contact layer.

3. The method of claim 2, wherein manufacturing the FEOL piece further comprises manufacturing the FEOL piece to meet a design rule not required by the BEOL piece.

4. The method of claim 2, wherein manufacturing the BEOL piece further comprises manufacturing the BEOL piece to have a plurality of metal layers.

5. The method of claim 1 wherein manufacturing the BEOL piece further comprises manufacturing the BEOL piece to have a plurality of metal layers.

6. The method of claim 1, further comprising:
   packaging the semiconductor die to form a packaged device.

7. The method of claim 6 further comprising:
   performing functional testing functionality of the semiconductor die.

8. The method of claim 6 further comprising:
   performing functional testing functionality of the packaged device.

9. The method of claim 1 further comprising:
   utilizing a specific result of the parametric testing on the FEOL piece to determine if the FEOL piece is to be merged to a BEOL piece.

10. The method of claim 1 further comprising:
performing continuity testing on the BEOL piece during manufacturing of the BEOL piece.

11. The method of claim 10 further comprising:
utilizing a result of continuity testing on the BEOL piece to determine if the BEOL piece is to be merged to a FEOL piece.

12. The method of claim 1 wherein manufacturing the FEOL piece comprises manufacturing the FEOL piece to have a first major surface area that is different than a second major surface area of the BEOL piece.

13. The method of claim 1 further comprising:
determining a major surface area of the BEOL piece based upon a BEOL process.

14. The method of claim 13 further comprising:
determining a major surface area of the FEOL piece based upon a FEOL process.

15. The method of claim 13, wherein the major surface area of the BEOL piece is greater than the major surface area of the FEOL piece.

16. The method of claim 13, wherein the major surface area of the BEOL piece is less than the major surface area of the FEOL piece.

17. The method of claim 1, wherein manufacturing the FEOL piece comprises manufacturing the FEOL piece to have a first interface feature, and manufacturing the BEOL piece comprises manufacturing the BEOL piece to have a second interface feature.

18. The method of claim 17, wherein the first interface feature of the FEOL piece is compatible with the second interface feature of the BEOL piece.

19. The method of claim 17, wherein the first interface feature of the FEOL piece is of differing material than the material of the second interface feature of the BEOL piece.

20. The method of claim 1, wherein manufacturing the BEOL piece comprises manufacturing the BEOL piece with at least a portion of an optically transparent substrate material.

21. The method of claim 17, wherein manufacturing the BEOL piece further comprises a sufficient area of an optically transparent substrate material to allow for alignment.

22. A method comprising:
manufacturing a front-end-of-Line (FEOL) piece of a semiconductor die, wherein the front-end piece has a first set of critical dimensions;
performing parametric testing on the FEOL piece;
manufacturing a back-end-of-line (BEOL) piece of a semiconductor die independent of the front-end piece, wherein the back-end piece has a second set of critical dimensions; and
joining the front-end piece and the back-end piece to form a functional semiconductor device.

23. The method of claim 21 wherein manufacturing the FEOL piece comprises manufacturing the FEOL piece to have a first interface feature and manufacturing the BEOL piece comprises manufacturing the BEOL piece to have a second interface feature.

24. The method of claim 23 wherein the first interface feature of the FEOL piece is compatible with the second interface feature of the BEOL piece.

25. A method comprising:
receiving a front-end-of-line piece from a first manufacturing line;
performing parametric testing on the FEOL piece;
receiving a back-end-of-line piece from a second manufacturing line; and
joining the front-end-of-line piece to the back-end-of-line piece to form a semiconductor device.

26. The method of claim 25 further comprising:
providing a device specification for the front-end-of-line piece to the first manufacturing line; and
providing a device specification for the back-end-of-line piece to the second manufacturing line.

27. The method of claim 26, wherein the first manufacturing line supports a first set of design rules not supported by the second manufacturing line.

* * * * *